United States Patent [19]

Middy

[11] 4,433,199

[45] Feb. 21, 1984

[54] SOLAR INSOLATION AND CONCENTRATION BY COUPLED FIBER OPTICS

[76] Inventor: Gerald W. Middy, 938 20th St., Santa Monica, Calif. 90403

[21] Appl. No.: 389,440

[22] Filed: Jun. 17, 1982

[51] Int. Cl.³ .......................................... H01L 31/04
[52] U.S. Cl. .................................................. 136/246
[58] Field of Search ........................................ 136/246

[56] References Cited

U.S. PATENT DOCUMENTS

| | | | |
|---|---|---|---|
| 4,021,267 | 5/1977 | Dettling | 136/246 |
| 4,151,005 | 4/1979 | Strebkov et al. | 136/256 |
| 4,210,121 | 7/1980 | Stark | 126/424 |
| 4,350,837 | 9/1982 | Clark | 136/246 |
| 4,367,366 | 1/1983 | Bloss et al. | 136/246 |

*Primary Examiner*—Aaron Weisstuch
*Attorney, Agent, or Firm*—William H. Maxwell

[57] ABSTRACT

A plurality of bundles of fiber optic light pipes are each arranged for the reception of a selected color band of monochromatic light emanating through a prism with which they act in combination as a secondary concentrator. Incoming multiple wavelength sunlight from a primary concentrator is directed through said prism, and photovoltaic cells are positioned at a spectrum plane according to their efficiency in relation to said selected color bands of the spectrum.

8 Claims, 9 Drawing Figures

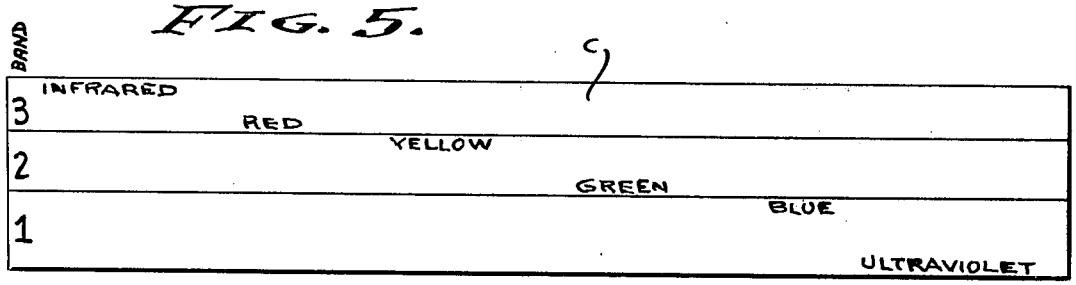
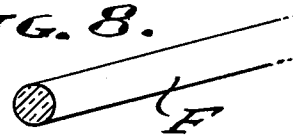
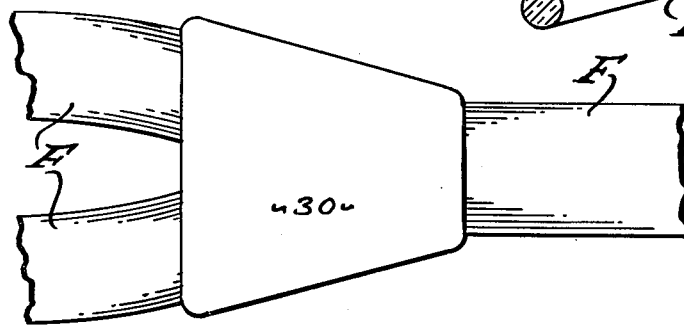
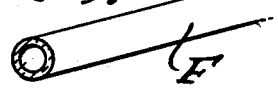
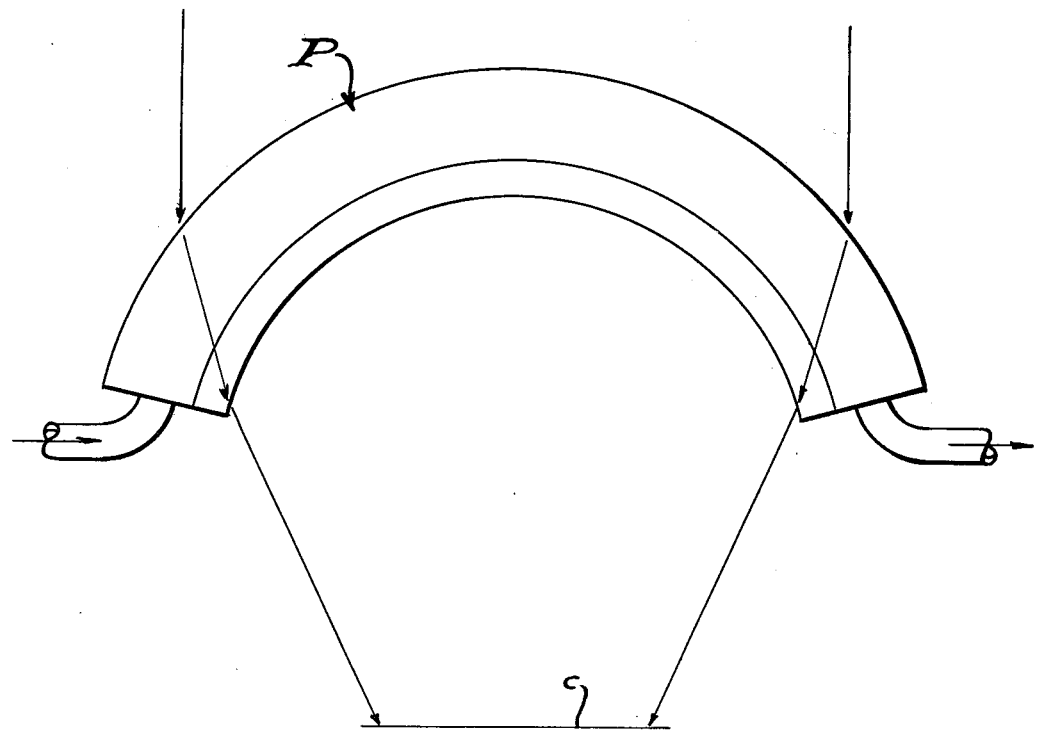

SOLAR INSOLATION AND CONCENTRATION BY COUPLED FIBER OPTICS

BACKGROUND

This invention relates to the tracking of the sun and insolation by means of fiber optics which concentrates light of selected wavelengths onto photovoltaic cells of energy efficient design. Heretofore, a multiplicity of mirrors and/or lenses have been employed in order to focus onto a target which is thereby subjected to intense heat for the generation of energy in one form or another, and all of which requires substantial space and has its limitations with respect to sun tracking. Accordingly, solar energy has been collected through the insolation of heat via a fluid media into a storage mass and through the generation of electrical energy by photovoltaic means, it being a general object of this invention to provide improved concentration by means of fiber optics, whereby sunlight is concentrated and divided according to wavelength and directed onto photovoltaic cells that are complementary to said wavelengths and therefore energy efficient.

Filaments of certain transparent materials are known to transmit light over considerable distances and at reasonably high efficiency. Silica glass and certain plastic filaments are reasonably inexpensive materials used for this purpose, and quartz filaments are more expensive and known for high intensity concentration and/or transmission of light. Fiber optics utilizing bundles of elongated filaments for the transmission of light are known to transmit light efficiently, with internal reflection defined by an accepted reception and internal reflection angle of 68°. The great advantage in these bundles of fibers is their flexibility and the angular redirection of light made possible thereby. It is an object of this invention to advantageously employ the angular redirection of light available with fiber optic bundles for the concentration of sunlight into or onto energy generator means, such as photovoltaic cells. In practice, sun tracking is by means of an astro-clock that maintains a primary concentrator in normal alignment with the suns rays, or a fixed primary concentrator with special lenses and/or reflectors. With the present invention, primary concentration directs a multi-sun band of light through a prism that separates it into a spectrum of monochromatic bands ranging from infrared to ultraviolet, and to each of said spectrum bands at least one bundle of fiber optic filaments is exposed and directed to a complementary photovoltaic cell that operates efficiently within the range of light to which it is exposed.

The heat of solar concentration is diverted in the protective system provided herein so that plastic or silica glass or quartz fibers may be used as required. Although high temperature quartz fiber optic filaments are readily available, their cost is greater than that of the other mentioned fibers. Accordingly, it is an object of this invention to transmit cold light concentration where the source ends of the fiber optic filaments must be protected from excessive heat otherwise caused by the concentration of intensified light. In practice, the insolation of heat by transmission through the prism is by means of a heat storage media, a fluid, that is circulated therethrough.

The angular redirection of sunlight and its concentration onto the generating plane of the photovoltaic cell or cells is by means of training the bundles of fiber optic filaments from a spectrum plane to an energy generating plane, or planes. Accordingly, the entire source area or plane is arranged selectively according to light wavelength, and the bundles of light pipes are selectively directed onto a plurality of photovoltaic cells that are subjected to all of the light emanating through the prism, for complete and efficient energy generation.

SUMMARY OF THE INVENTION

Solar energy acquisition by fiber optics is provided by this invention, whereby multiple suns are concentrated further after primary concentration and applied to selectively efficient photovoltaic cells for energy efficient power generation. Primary concentration is by means of linear parabolic refelction of sunlight into a multi-sun band of intensified light that is passed through a prism and separated into bands of spectrum light. Secondary concentration is by means of fiber optics combined with said prism, wherein bundles of light pipe filaments are aligned with selected bands of spectrum light and each directed to photovoltaic cells that are complementary to that selected wavelength of light and of a design that is energy efficient therewith. In practice, a multiplicity of bundles of fibers are employed, and at least one for each color range of the spectrum, and each group or combined groups of fibers fully exposes at least one photovoltaic cell.

The foregoing and various other objects and features of this invention will be apparent and fully understood from the following detailed description of the typical preferred forms and applications thereof, throughout which description reference is made to the accompanying drawings.

BRIEF DESCRIPTION OF THE DRAWINGS

FIG. 5 is a view taken as indicated by line 5—5 on FIG. 1, showing the spectrum comprised of bands of monochromatic light projected upon the source plane and into the light pipes illustrated in FIGS. 2, 3 and 4.

FIG. 6 is a view of a coupler by which two bundles of light pipes merge into one in order to increase intensity, or vice versa.

FIG. 7 is a side view of the secondary concentrator prism, shown in arcuate form that concentrates projection of monochromatic light onto a shortened source plane.

Figure 1:
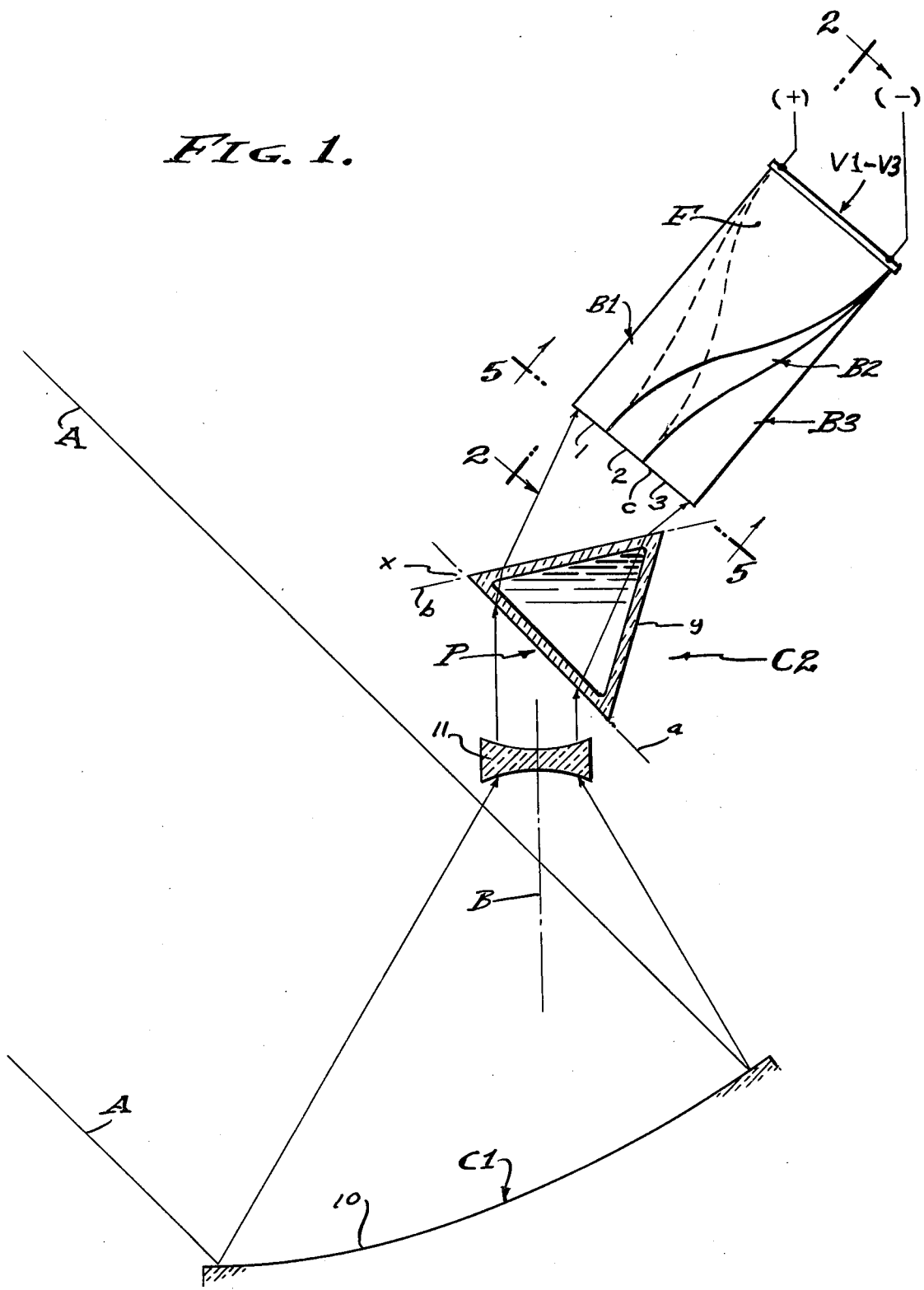
FIG. 1 is a side view showing the primary and secondary concentrators of the present invention, receiving sunlight and intensifying the separated wavelengths thereof upon photovoltaic cells for power generation.
Figure 2:
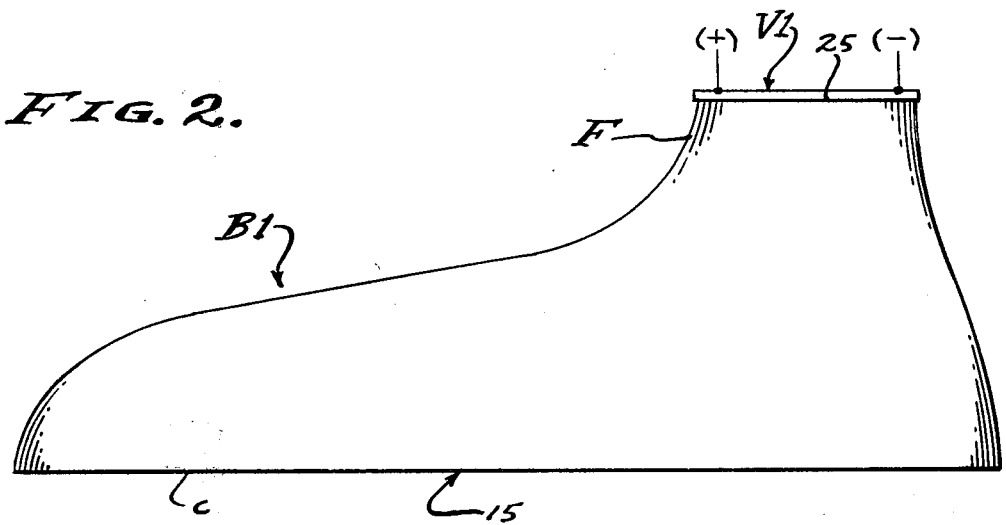
FIG. 2 is a view taken substantially as indicated by line 2—2 on FIG. 1, showing the separation of light by means of a bundle of light pipes leading to a first and distinct photovoltaic cell.
Figure 3:
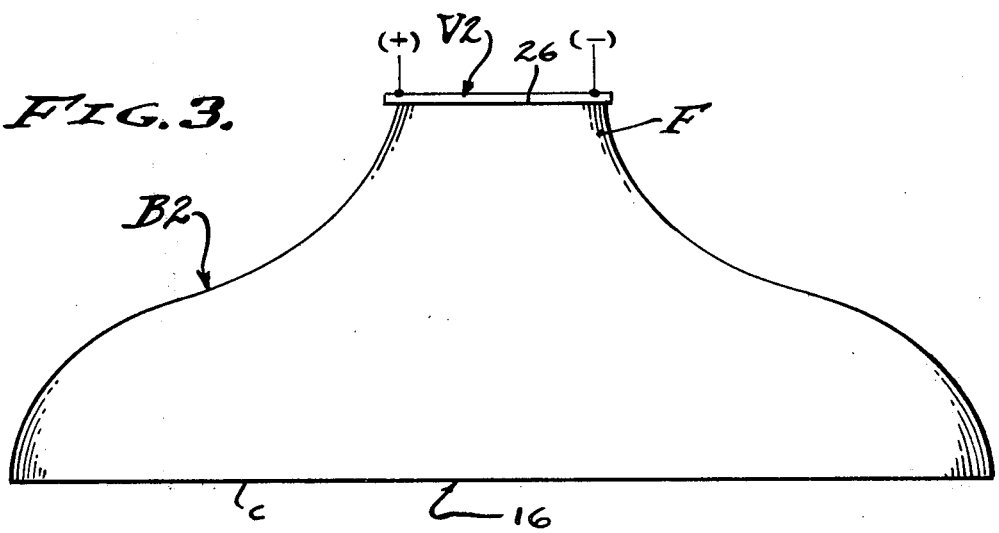
FIG. 3 is a view similar to FIG. 2, showing the separation of light by means of a bundle of light pipes leading to a second and distinct photovoltaic cell.
Figure 4:
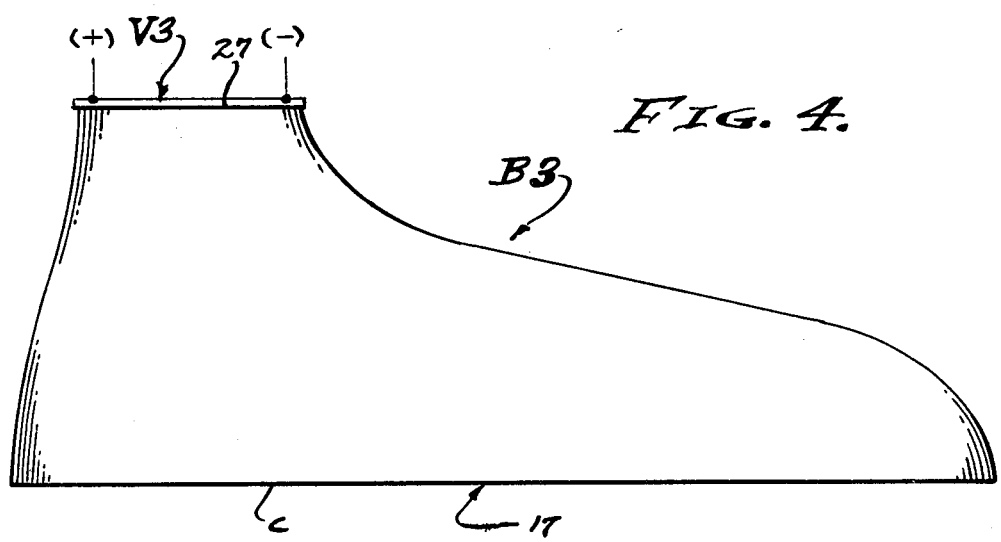
FIG. 4 is a view similar to FIGS. 2 and 3, showing the separation of light by means of a bundle of light pipes leading to a third and distinct photovoltaic cell.

And, FIGS. 8 and 9 are perspective views of the end or cut-off portions of solid and of tubular light pipes respectively.

DESCRIPTION OF THE PREFERRED EMBODIMENT

Referring now to the drawings, solar energy acquisition is disclosed herein as involving generally, a primary concentrator C1 comprised of a linear parabolic reflector, and a secondary concentrator C2 comprised of a linear prism P in combination with a multiplicity of fiber optic bundles B1, B2 and B3 of light pipe fibers or filaments F, and a multiplicity of distinct photovoltaic cells V1, V2 and V3 and each associated with a selected fiber optic bundle B1, B2 or B3 respectively. It is to be understood that the multiplicity of fiber optic bundles and associated photovoltaic cells can vary in number from two or more and that multiple bundles can be and are coupled as required in order to concentrate a selected color band of light to one or more cells.

The primary concentrator C1 is embodied in a linear parabolic reflector that has a curvilinear face 10 adapted to receive straight incoming sunlight along lines A—A and to concentrate the same as multi-suns along an axis B angularly disposed to and offset from lines A—A, and so that all of the sunlight striking the face 10 is projected onto the secondary concentrator C2 as a band of intensified light. In order words, there is a narrowed or linear band of light having substantial width projected onto the plane a as shown in FIG. 1 of the drawings. The reflector 10 is parabolic whereby light concentration is symmetrical about the axis B, and the converging light rays are preferably straightened ahead of plane a as by means of a lens system shown herein simply as a concave linear lens 11 coextensive with the linear concentrator face 10. All incoming light is therefore projected as straight parallel light onto the plane a.

The secondary concentrator C2 comprises in combination the prism P and the multiplicity of fiber optic bundles B1, B2 and B3 that direct the band of light from plane a to the multiplicity of photovoltaic cells V1, V2 and V3. The prism P is linearly coextensive with the reflector face 10 and refractive lens 11, to receive intensified multi-wavelength sunlight for refraction therethrough and the projection of a spectrum of substantially monochromatic light bands from plane b. As shown, the planes a and b are coincidental with the angularly related faces of the refractive prism P, having an apex x and an inactive face y. The divergent spectrum ranging from infrared to ultraviolet light is projected to a source plane c spaced from the prism face b a distance as may be required to establish the width of the color bands comprising the spectrum which is as-simulated by the light pipes of the fiber optic system next described. In FIG. 7 of the drawings the prism P is shown as being curvilinear for intensifying the projected spectrum to the source plane c. Accordingly, the prism P is of the cross section shown in FIG. 1, and by virtue of its elongated curved and/or arcuate configuration it concentrates the spectrum linearly. As shown in FIG. 5, the color bands increase in wavelength through (1) ultraviolet-blue, (2) green-yellow, and (3) red-infrared; and for the purpose of disclosure here, these three areas or general bands of the spectrum will be associated with distinct photovoltaic cells and each efficient for power generation when subjected to those respective bands of the spectrum.

Light pipes of transparent material are known to transmit light through curved paths (other than straight), and are ordinarily made of fiber optic filaments such as quartz, glass or plastic. The diameter of each fiber or filament is for example 2 microns up to 250 microns, depending upon the type of material and service intended. The filaments are gathered into bundles and encased in a sheath of plastic such as polyvinyl chloride or the like, and the ends are usually bonded together with an epoxy material and polished. Light pipes as such are referred to as fiber optic bundles, a characteristic feature being their flexibility whereby light waves can be directed through tortuous paths as circumstances require.

Referring now to FIGS. 1 and 2–4 of the drawings, there is a multiplicity of fiber optic bundles B1, B2 and B3 shown therein, and each aligned with an area 1, 2 and 3 of the spectrum at the source plane c. As shown, the polished source end 15 of fiber optic bundle B1 is coextensive with the area of the ultraviolet-blue spectrum band 1, end 16 of the fiber optic bundle B2 is coextensive with the area of the green-yellow spectrum band 2, and end 17 of the fiber optic bundle B3 is coextensive with the area of the red-infrared spectrum band 3. Accordingly, the source ends 15, 16 and 17 of the fiber optic bundles are flattened as clearly shown in the drawings, one disposed contiguous to the other to occupy the entire spectrum area of projected intensified sunlight. In practice, the source ends 15, 16 and 17 are shaped as may be required in order to compensate for any distortion of the spectrum at the source plane c, in order that monochromatic light is received by the respective fiber-optic bundles B1, B2 and B3.

In carrying out this invention, the resolution of source reception into the fiber optic bundles can vary as required, dependent upon the wavelength of light to be transmitted through said bundles. Accordingly, the adjacent fibers or filaments are in layers of one or more deep, and for example in FIG. 4 they can be one or more fibers deep and associated with a narrow monochromatic band of light (blue). The deepness or width of spectrum bands to be transmitted is controlled by the corresponding deepness or width of the source ends 15, 16 and 17.

The fiber optic bundles B1, B2 and B3 terminate at the photovoltaic cells V1, V2 and V3, where each bundle is shaped in cross section to be coextensive with the area of the particular cell to which it exposes transmitted light. As shown, the photovoltaic cells are round in which case the terminal ends of the bundles are likewise round. Accordingly, all fibers or filaments emanating from source end 15 terminate at the terminal transmitting end 25, all fibers or filaments emanating from source end 16 terminate at the terminal transmitting end 26, and all fibers or filaments emanating from source end 17 terminate at the terminal transmitting end 27. A feature is the transition from elongated linear bands of source light of the spectrum to consolidated round or substantially square screens of light, or any other required configuration at the transmitting ends of the bundles as circumstances require.

Photovoltaic cells are known for their ability to generate electrical potential when exposed to light, and their sensitivity to different light wavelengths depends upon their design and basic materials employed in their construction. Design variations involve band gap, absorption spectrum of the cell material, thickness, the bonding and the doping. Generally, a basic material employed for photovoltaic cells efficient with ultraviolet-blue light is Gallium Aluminum Arsenide; with green-yellow light a basic material is Gallium Arsenide; and with red-infrared light a basic material is Silicon or Cadmium Sulphide. It is to be understood that there are other basic cell materials and that the manners of construction affects efficiency when exposed to specific wavelengths of light.

As shown, photovoltaic cell V1 is a Gallium Aluminum Arsenide cell best subject to the ultraviolet-blue range of light transmitted at the terminal end 25 of the fiber optic bundle B1; photovoltaic cell V2 is a Gallium Arsenide cell best subject to the green-yellow range of light transmitted at the terminal end 26 of the fiber optic bundle B2; and photovoltaic cell V3 is a Selenium or Cadmium Sulphide cell best subject to the red-infrared range of light transmitted at the terminal end 27 of the fiber optic bundle B3. Accordingly, all of the spectrum is projected onto the power generating photovoltaic cells V1, V2 and V3, and each of which is efficient within the range of light wavelengths to which it is exposed and subjected.

Heat is absorbed from the secondary concentrator C2, before projecting the spectrum light through the fiber optic bundles B1, B2 and B3. As shown in FIG. 1 the prism P is liquid filled, and said liquid being a heat transfer media circulated therethrough as is indicated in order to carry off heat of insolation which can be used for utilitarian purposes. Accordingly, the light emitted from prism P is relatively cold light.

Heat is also absorbed from the optic bundles B1, B2 and B3 wherein sections thereof are comprised of tubular light pipes through which a heat liquid media is circulated. In practice, tetrachloroethylene or the like is used and which efficiently transmits light. In FIG. 6 of the drawings a bifurcated coupling 30 is shown which joins a pair of optic bundles to a single optic bundle, for intensification of light or visa versa as may be required in order to control heat. In these manners, the sections of light transmitting bundles control both light transmission and heat thereof.

From the foregoing it will be seen that I have provided a highly efficient photovoltaic power generating system wherein selected wavelengths of light are associated with complementary and distinct voltaic cells of optimum design for generation from the wavelengths of light to which they are exposed. The prism P can be a straight prism as indicated in FIG. 1 or it can be a curvilinear prism as shown in FIG. 7. The primary concentrator C1 can project a band of light through at least one secondary concentrator C2, or through a plurality of secondary concentrators C2 by widening the band of light through the lens 11 and/or through a plurality of lenses 11 to be received by adjacently related prisms P for transmission through a plurality of separate source planes c all as hereinabove described.

Having described only the typical preferred forms and applications of my invention, I do not wish to be limited or restricted to the specific details herein set forth, but wish to reserve to myself any modifications or variations that may appear to those skilled in the art as set forth within the limits of the following claims.

I claim:

1. Solar insolation and power generation means which includes:
    a primary concentrator means comprising a linear parabolic reflector projecting a narrowed band of light through a first plane,
    a secondary concentrator means comprising, in combination, a prism disposed to receive said narrowed band of light through said first plane and by refraction projecting said light in the form of a spectrum of substantially monochromatic areas of light from a second plane and through a third source plane, and a plurality of bundles of fiber optic light pipes having source ends aligned at said third source plane with a substantially monochromatic area of light and arranged in pairs of bundles coupled into single bundles thereof by means of bifurcated couplings therefor and having light concentrating ends remote from said source ends,
    and a power generation means comprising a photo voltaic cell at a fourth plane coincidental with and coextensive with said concentrating ends of each of said plurality of bundles and receiving said substantially monochromatic light for electrical power generation.

2. The solar power generation means as set forth in claim 1, wherein the prism of the secondary concentrator is a curvilinear transparent body for linear refractive concentration of the spectrum through the second plane and for projection through the third source plane.

3. The solar power generation means as set forth in claim 1, wherein the secondary concentrator means comprises a plurality of bundles of fiber optic light pipes and each having a source end aligned with a separate monochromatic area of light and having a transmitting end remote from said source end, and a separate power generating means which comprises a photovoltaic cell at a fourth plane coincidental with and coextensive with each of said transmitting ends.

4. The solar power generation means as set forth in claim 1, wherein the secondary concentrator means comprises a plurality of bundles of fiber optic light pipes to cover the spectrum and each having a source end adjacently aligned with a separate monochromatic area of light and having a transmitting end remote from said source end, and a separate power generating means which comprises a photovoltaic cell at a fourth plane coincidental with and coextensive with each of said transmitting ends.

5. The solar power generation means as set forth in claims 1 and 2, wherein the prism of the secondary concentrator is an elongated linear transparent body for refractive concentration of the spectrum through the second plane and for projection through the third source plane.

6. The solar power generation means as set forth in claims 1 or 3, wherein the fiber optic light pipes for light transmission are tubular and liquid filled with transparent heat transfer media circulated therethrough.

7. The solar power generation means as set forth in claims 1, 2, 3 or 4, wherein the projected and narrowed band of light is straightened by a linear lens system preceeding said first plane.

8. The solar power generation means as set forth in claims 1, 2, 3 or 4, wherein the photovoltaic cell of the power generation means is in each instance of a particular type efficient for the wavelength of the substantially monochromatic light to which it is exposed.

* * * * *